(12) United States Patent
Farooqui

(10) Patent No.: US 6,867,654 B2
(45) Date of Patent: Mar. 15, 2005

(54) ADDITIVE PHASE DETECTOR AND ITS USE IN HIGH SPEED PHASE-LOCKED LOOPS

(76) Inventor: Arshad Suhail Farooqui, Suite G02, 2320 Century Sq., Jalan Usahawan, 63000 Cyberjaya (MY)

( * ) Notice: Subject to any disclaimer, the term of this patent is extended or adjusted under 35 U.S.C. 154(b) by 67 days.

(21) Appl. No.: 10/601,217

(22) Filed: Jun. 20, 2003

(65) Prior Publication Data

US 2004/0257163 A1 Dec. 23, 2004

(51) Int. Cl.[7] ............... H03D 13/00; H03L 7/085
(52) U.S. Cl. .................. 331/25; 331/8; 327/5; 327/7
(58) Field of Search ................ 331/8, 17, 25; 327/3, 5, 7; 329/345

(56) References Cited

U.S. PATENT DOCUMENTS

| | | | |
|---|---|---|---|
| 3,628,046 A | * | 12/1971 | Bilotti ............ 307/81 |
| 4,849,619 A | | 7/1989 | Miida et al. |
| 4,870,303 A | | 9/1989 | McGinn |
| 5,781,036 A | | 7/1998 | Williams et al. |
| 6,137,852 A | | 10/2000 | McGinn et al. |
| 6,496,077 B2 | | 12/2002 | Ahn |

* cited by examiner

Primary Examiner—David Mis
(74) Attorney, Agent, or Firm—DeMont & Breyer, LLC

(57) ABSTRACT

An apparatus is disclosed that is an analog phase detector where a summation technique is used to determine the phase difference of the two input waveforms of the phase detector. Instead of multiplying the two signals—a technique used in the prior art—a difference amplifier subtracts one waveform from the other. The difference amplifier produces a waveform whose maximum peak-to-peak amplitude is directly proportional to the phase difference. Feeding this waveform into an envelope detector followed by a low pass filter, we are able to get a DC voltage level that is directly proportional to the phase difference of the two input waveforms.

20 Claims, 10 Drawing Sheets

100

(a)

SINGLE ENDED (b)

DIFFERENTIAL (a)

(b)

ADDITIVE PHASE DETECTOR AND ITS USE IN HIGH SPEED PHASE-LOCKED LOOPS

FIELD OF THE INVENTION

The present invention relates to phase-locked loops in general, and, more particularly, to phase detectors incorporated within phase-locked loops.

BACKGROUND OF THE INVENTION

The concept of phase locking was invented in the 1930s and swiftly found wide use in electronics and communications. While the basic phase-locked loop has remained nearly the same since then, its implementation in different technologies and for different applications continues to challenge designers. A phase-locked loop serves the task of clock generation for a microprocessor as well as for frequency synthesizers for cell-phones.

Typically, a phase-locked loop is a non-linear analog device that uses a negative feedback loop to make the phase difference between an Input signal and an output signal smaller, preferably, approximately equal to zero. The phase difference between both signals becomes smaller and smaller, which also makes the frequency of both signals equal.

FIG. 1 depicts block diagrams of (a) a single-ended (signal-to-ground) and (b) differential phase-locked loop of the prior art. The phase locked-loop comprises three components: a phase detector, a low pass filter, and a voltage-controlled oscillator. In the single-ended version of FIG. 1a, an input voltage of a given frequency, $V_{IN}$, is feed to one input of phase detector 101 on terminal 108-1 relative to ground potential. The output voltage of phase detector 101, $V_{PD}$, feeds low-pass filter 102 on terminal 108-3. The output of low-pass filter 102, $V_{LPF}$, feeds voltage-controlled oscillator 103. The output of voltage controlled oscillator 103, $V_{VCO}$, is fed back to a second input terminal 108-2 of phase detector 101.

Phase detector 104, low-pass filter 105, and voltage-controlled oscillator 106 comprise a differential voltage phase-locked loop alternative to FIG. 1a. The main difference between FIG. 1b and 1a is that all signals are differential: input voltage $V_{IN}$ feeds phase detector 104 on terminals 107-1 and 107-2. The second set of differential Input terminals of phase detector 104, terminals 107-3 and 107-4, have the output signal of the voltage-controlled oscillator, $V_{VCO}$ impressed upon them. The output voltage of phase detector 104, $V_{PD}$ is fed to the input terminals 107-5 and 107-6 of low pass filter 105. Finally the output voltage of low-pass filter 105, $V_{LPF}$ is fed differentially to voltage controlled oscillator 106.

In the phase-locked loop of FIG. 1, the edges of $V_{VCO}$ are "skewed" by $\phi$ seconds with respect to $V_{IN}$. Assuming that the VCO has a single control input, we note that to vary the phase, we must vary the frequency of the voltage-controlled oscillator. The output phase of the voltage-controlled oscillator can be stepped up or stepped down by momentarily changing the frequency of the voltage-controlled oscillator to "accumulate phase" faster until $V_{VCO}$ and $V_{IN}$ are aligned again.

Thus, there must be a means of comparing the two phases, i.e., a phase detector, is used to determine when the voltage-controlled oscillator and the reference signals are aligned. The task of aligning the output phase of the voltage-controlled oscillator with the phase of the reference is called "phase locking."

What makes the signals smaller and smaller is the interaction of the phase detector and the voltage-controlled oscillator. It may seem that only these two components are needed. However, the control voltage of the voltage-controlled oscillator must remain quiet in the steady state. The phase detector output, $V_{PD}$, typically contains both a DC component (desirable) and high-frequency components (undesirable), so that a low pass filter is interposed between the phase detector and the voltage-controlled oscillator.

Let us now analyze the response of a phase-locked loop in locked condition to a small phase or frequency transient at the input. FIG. 2 depicts timing diagrams of the phase-locked loop of FIG. 1a to a step change of phase. Initially the phase-locked loop is in the locked condition. Assume the input waveform of FIG. 2a and the output waveform of FIG. 2c can be expressed as $$V_{IN}(t)=V_A \cos\omega_1 t$$

$$V_{OUT}(t)=V_B \cos(\omega_1 t+\phi_0),$$

Where higher harmonics are neglected and $\phi_0$ is the static phase error. When the input experiences a phase step of $\phi_1$ at $t=t_1$ as in FIG. 2b. Since the output of the low pass filter does not change instantaneously, the voltage-controlled oscillator continues to oscillate at $\omega_1$. The growing phase difference between the input and the output then creates wide pulses at the output of the phase detector, as in FIG. 2d, forcing $V_{LPF}$ of FIG. 2e to rise gradually. As a result, the voltage-controlled oscillator frequency begins to change as shown in FIG. 2f in an attempt to minimize the phase error. Note that the loop is not locked during the transient because the phase error varies with time. If the loop is to return to lock, $\omega_{OUT}$ of FIG. 2f must eventually go back to $\omega_1$, requiring that $V_{LPF}$ and hence $\phi_{OUT}-\phi_{IN}$ also return to their original values. Consequently, as shown in FIG. 2, $\phi_{OUT}$ gradually "catches up" with $\phi_{IN}$.

The phase detector can come in both digital and analog flavors. FIG. 3 depicts the logic diagram of a single-ended, digital implementation of phase detector 101 of the prior art. In FIG. 3a, the phase detector is simply an exclusive-or gate. FIG. 3b depicts two digital signals impressed on the inputs of the exclusive-or gate. The two signals are out of phase with each other by a difference of $\phi$ seconds. This results in an output waveform of the exclusive-or gate that is itself a pulse train. The width of the pulses is proportional to the difference in phase.

FIG. 4 depicts a schematic diagram of a differential analog version of the most common implementation of a phase detector in the prior art, known as a Gilbert Multiplier cell. Assuming all the transistors in FIG. 4 are biased in the saturation region and obey the ideal square-law equation and that devices are sized and matched so that the transconductance parameters satisfy the equation $g_{m3}=g_{m4}=g_{m5}=g_{m6}=g_{ma}$, and $g_{m1}=g_{m2}=g_{mb}$. Defining the output currents $I_{o1}=-(I_3+I_5)$ and $I_{o2}=-(I_4+I_6)$, it can shown that if R1=R2, then differential output voltage $V_{PD}=R1(I_{o2}-I_{o1})$ or $$V_{PD}=R1 \times V_{IN} \times V_{VCO} \times \sqrt{2g_{ma} \times g_{mb}}$$

The Gilbert Multiplier cell multiplies the two input waveforms in the time domain. So for sinusoidal inputs $$V_{PD}(t)=\sin(\omega t) \times \sin(\omega t+\phi)$$

Where $\omega$ is the frequency in radians per second t is time in seconds $\phi$ is the phase difference between the two waveforms in radians.

The output of the Gilbert cell is therefore: $= 0.5(\cos(\omega t - \omega t - \phi) -$ $$\cos(\omega t + \omega t + \varphi)$$

$$= 0.5(\cos(\phi) - \cos(2\omega t + \phi))$$

and when filtered by the low pass filter of a phase-locked loop produces a signal, $V_{PD}=0.5*\cos(\phi)$, a quantity directly proportional to the phase difference.

SUMMARY OF THE INVENTION

The Illustrative embodiment of the present invention is an analog phase detector where a summation technique is used to determine the phase difference of the two input waveforms. Instead of multiplying the two signals, a difference amplifier subtracts one waveform from the other. The difference amplifier produces a waveform whose maximum peak-to-peak amplitude Is directly proportional to the phase difference. Feeding this waveform into an envelope detector followed by a low pass filter, we are able to get a DC voltage level that is directly proportional to the phase difference of the two input waveforms.

The illustrative embodiment comprises: (1) a difference amplifier comprising a first differential pair of terminals for carrying a first differential signal, a second differential pair of terminals for carrying a second differential signal, and a third differential pair of terminals for carrying a third differential signal, wherein said third differential signal is based on the difference between said first differential signal and said second differential signal; and (2) an envelope detector comprising a fourth differential pair of terminals electrically connected to said third differential pair of terminals, and a fifth differential pair of terminals for carrying a fourth differential signal, wherein said fourth differential signal is based on the peak-to-peak amplitude of said third differential signal.

DETAILED DESCRIPTION

Figure 5:
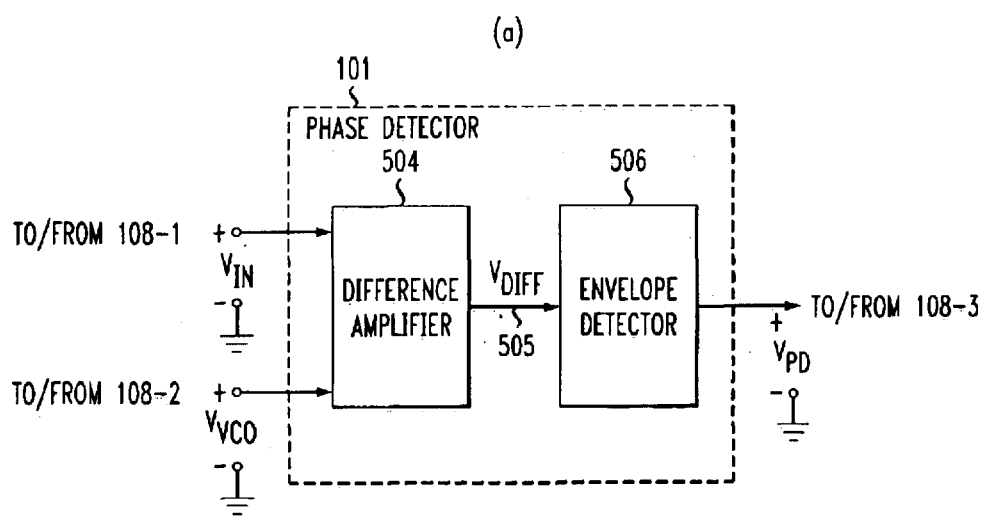
FIG. 5 depicts a block diagram of the salient components of the illustrative embodiment of the present invention.
Figure 5:
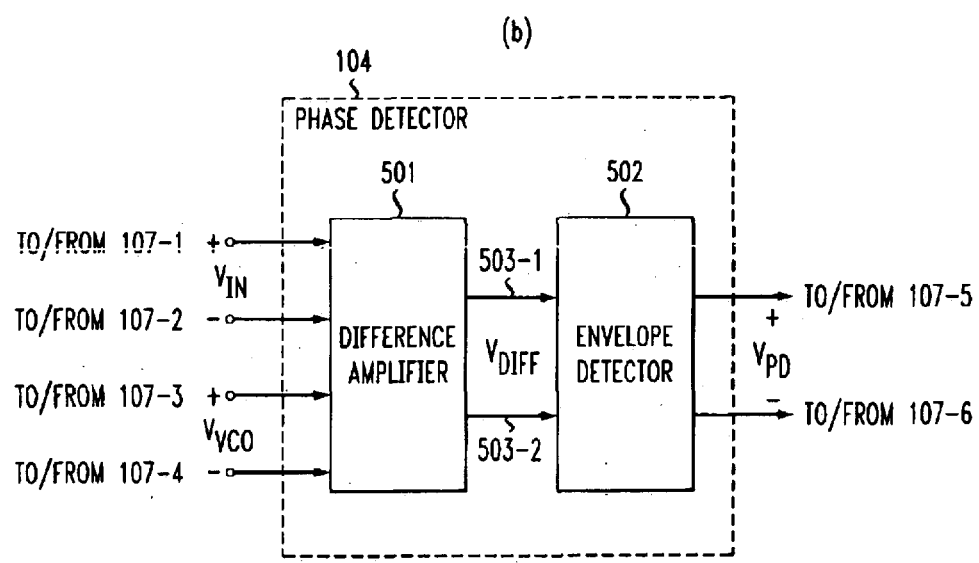

FIG. 5 depicts a block diagram of the salient components of the illustrative embodiment of the present invention. FIG. 5a shows the case of a phase detector constructed from a difference amplifier and an envelope detector in which the input and output signals are single-ended, i.e. between a single terminal and ground potential. Input signal $V_{IN}$ between terminal 108-1 and ground potential, is fed, along with the output of voltage-controlled oscillator 103, $V_{VCO}$ between terminal 108-2 and ground, to the inputs of difference amplifier 504. The output of difference amplifier 504, which is the voltage $V_{DIFF}$ between terminal 505 and ground potential, is fed to envelope detector 506. The output of envelope detector 506 is fed on terminal 108-3 to low pass filter 103, whose output $V_{VCO}$ is fed back to input 108-2 of the difference amplifier 504.

FIG. 5b depicts a differential version of the single-ended phase detector of FIG. 5a. In FIG. 5b, the differential voltage input, $V_{IN}$, is impressed on one pair of input differential terminals 107-1 and 107-2 of difference amplifier 501. The output from the voltage-controlled oscillator, $V_{VCO}$, is impressed on a second pair of input differential terminals 107-3 and 107-4 of differential amplifier 501. Difference amplifier 501 subtracts the voltage, $V_{VCO}$ from $V_{IN}$, producing output voltage $V_{DIFF}$, impressed between terminals 503-1 and 503-2. $V_{DIFF}$ is fed to the input terminals of envelope detector 502, which outputs the peak-to-peak voltage, an approximate DC voltage level, $V_{PD}$, to terminals 107-5 and 107-6 of the low pass filter. The low pass filter 105 obtains a DC level proportional to the phase difference between $V_{VCO}$ and $V_{IN}$, which is fed to voltage controlled oscillator 106, which in turn feeds its outputs, $V_{OUT}=V_{VCO}$ back to terminals 107-3 and 107-4 in a feedback loop to complete the phase-locked loop.

It should be clear to those skilled in the art how to construct a phase detector comprising a difference amplifier and an envelope detector from any combination of single-ended and differential components. Furthermore, it should be clear to those skilled in the art how to construct a phase detector from a difference amplifier and envelope detector operating on any combination of currents or voltages.

The illustrative embodiment uses a summation technique to determine the phase difference of the two input waveforms of the phase detector 104. Instead of multiplying the two signals, as in the prior art, one signal is subtracted from the other. If both signals are sinusoidal, represented as $\sin(\omega t)$ and $\sin((\omega t\, \phi)$ where ω is the frequency in radians per second t is time in seconds φ is the phase difference between the two waveforms in radians.

Then $$V_{DIFF}(t) = \sin(\omega t) - \sin(\omega t + \phi) \qquad \text{(Eq. 1)}$$

$$= 2\cos(0.5(\omega t + \omega t + \phi))\sin(0.5(\omega t + \omega t + \phi))$$

$$= 2\cos\left(\omega t + \frac{\phi}{2}\right)\sin\left(\frac{-\phi}{2}\right)$$

In this case the output is a waveform whose maximum amplitude is directly proportional to the phase difference between the two input signals. Feeding this wave into an envelope detector followed by a low pass filter, we are able to get a DC voltage level that is the peak-to-peak voltage of (1), which is directly proportional to the phase difference of the two input waveforms.

Figure 6:
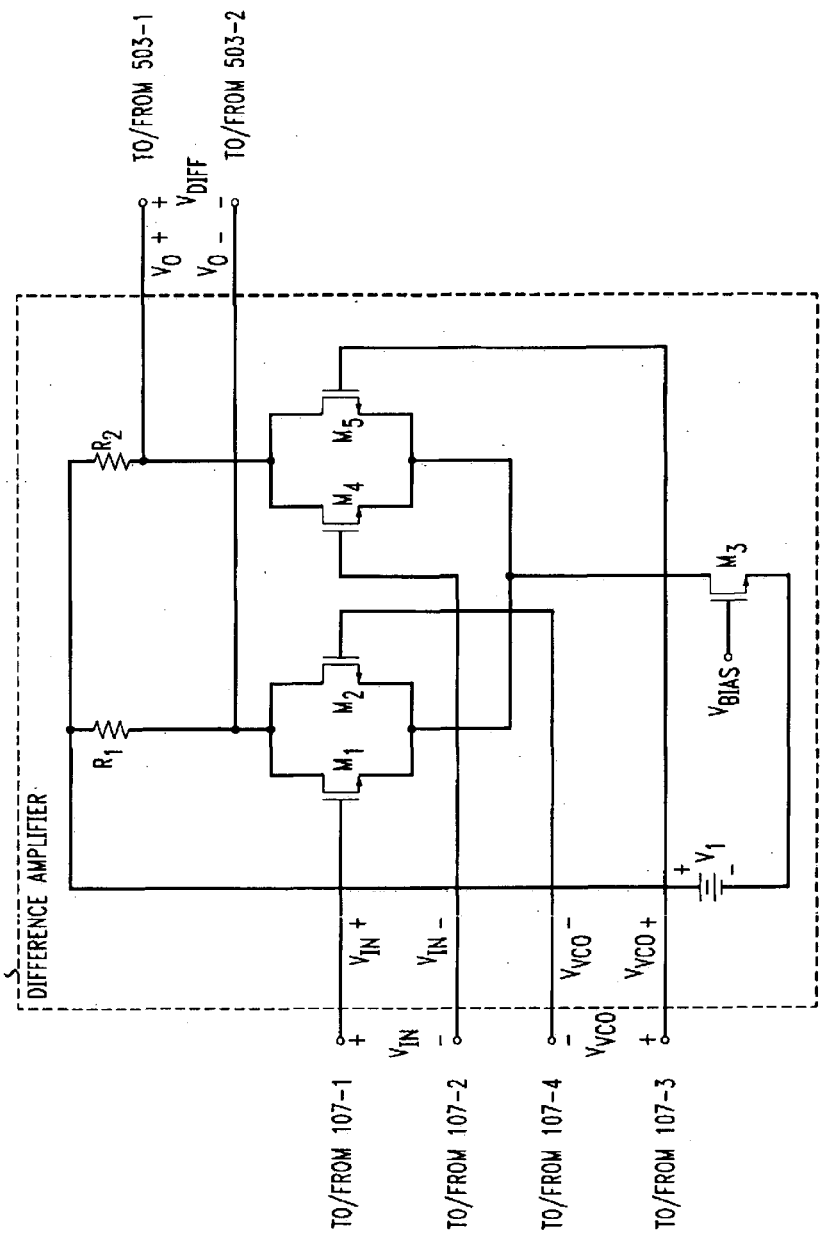
FIG. 6 depicts a schematic of the differential version of difference amplifier 501 of the illustrative embodiment of the present invention.

FIG. 6 depicts a schematic of the differential version of difference amplifier 501 of the illustrative embodiment of the present invention. The differential input voltage $V_{IN}$ on positive terminal 107-1 and negative terminal 107-2, respectively, are fed to the gate terminals of NMOS transistor M1 and M4, respectively. Likewise, the differential voltage-controlled oscillator output voltage $V_{VCO}$ on positive terminal 107-3 and negative terminal 107-4, respectively, are fed to the gate terminals of NMOS transistor M5 and M2, respectively.

A resistor R1 is electronically connected at one terminal to positive voltage supply V1, to one terminal of resistor R2, and to the drain terminal of NMOS transistor M1. The drain terminal of NMOS transistor M1 is electrically connected to the drain terminal of NMOS transistor M2, while the source terminal of transistor M1 is electrically connected to the source terminal of NMOS transistor M2. The source terminal of NMOS transistor M1 is electrically connected to the drain terminal of NMOS transistor M3, and the source terminal of NMOS transistor M3 is electrically connected to the negative terminal of power supply V1. The gate terminal of M3 is electrically connected to a second DC supply voltage $V_{BIAS}$ which sets the level of the DC current source formed by transistor M3.

The source terminal of M1 is electrically connected to the source terminal of NMOS transistor M4, while the source terminal of NMOS transistor M5 is electrically connected to the source terminal of M4. The drain terminal of transistor M4 is electrically connected to the drain terminal of transistor M5 and to a second terminal of resistor R2. The drain terminal of transistor M4 is electrically connected to positive output terminal 503-1, while the drain terminal of transistor M1 is electrically connected to the negative output terminal 503-2. The voltage impressed across these two terminals is the difference output voltage $V_{DIFF}$.

Figure 7:
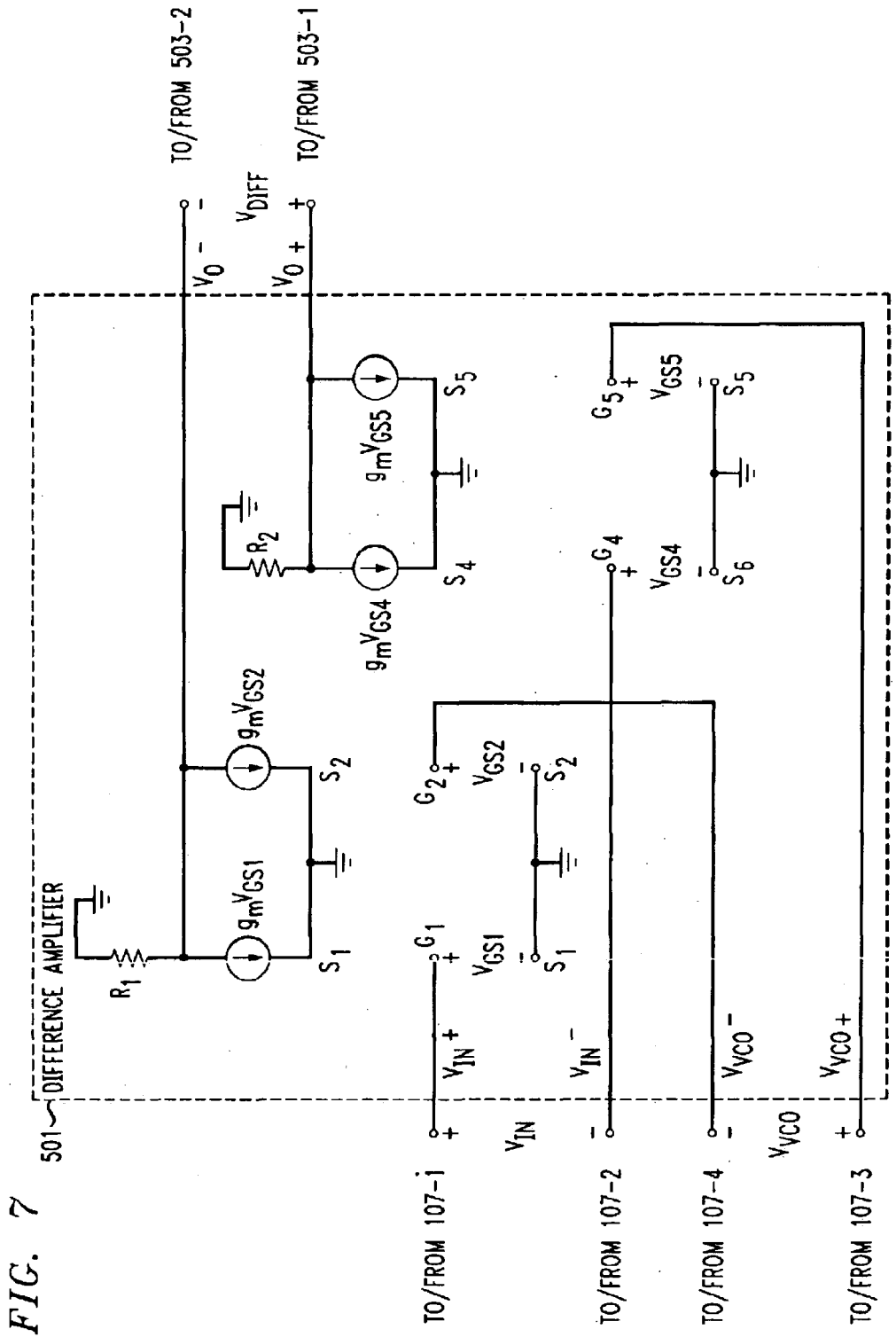
FIG. 7 depicts the small signal model of difference amplifier 501.

FIG. 7 depicts the small signal model of difference amplifier 501. Assuming all transistors have the same transconductance, $g_m$, we calculate the output terminal voltages $V_o^-$ and $V_o^+$ as follows:

$$V_o^- = -g_m(V_{GS1}+V_{GS2})$$

$$V_o^- = -g_m(V_{IN}^+ + V_{VCO}^-) \quad \text{(Eq. 2)}$$

$$V_o^+ = -g_m(V_{GS4}+V_{GS5})$$

$$V_o^+ = -g_m(V_{IN}^- + V_{VCO}^+) \quad \text{(Eq. 3)}$$

Thus, $$V_{DIFF} = V_o^+ - V_o^- = -g_m(V_{IN}^+ + V_{VCO}^-)R1 + g_m(V_{IN}^- + V_{VCO}^+)R2$$

If R1=R2, then $$V_{DIFF} = g_m R1[(V_{IN}^- - V_{IN}^+) + (V_{VCO}^+ - V_{VCO}^-)]$$

$$V_{DIFF} = -g_m R1[V_{IN} - V_{VCO}] \quad \text{(Eq. 4)}$$

This shows the output voltage of the difference amplifier is proportional to the difference between $V_{IN}$ and $V_{VCO}$.

Figure 8:
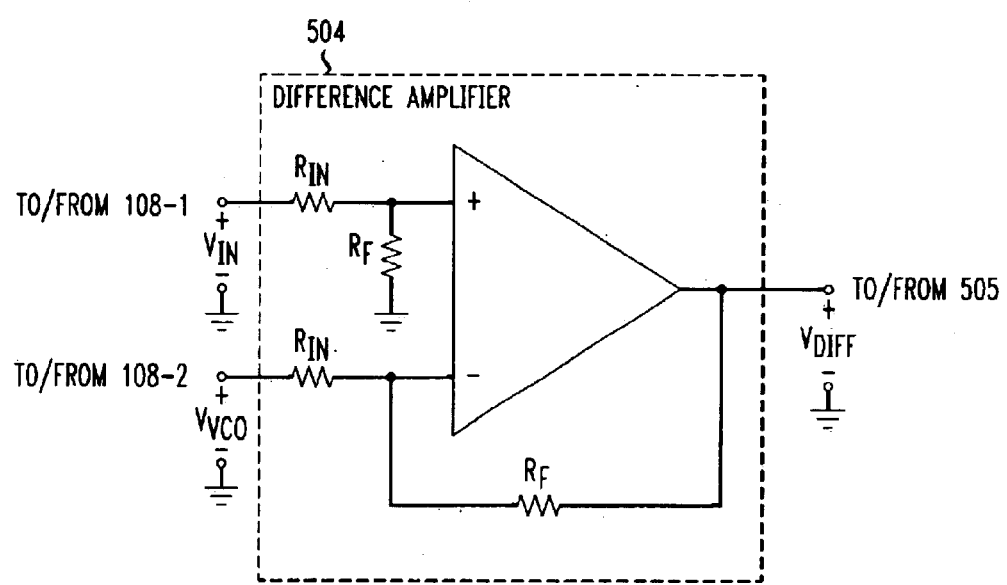
FIG. 8 depicts a schematic of a single-ended version of difference amplifier 504.

FIG. 8 depicts a schematic diagram of a single-ended version of difference amplifier 504. It is the classic difference amplifier created from an operational amplifier of any technology. If the operational amplifier is operating in its linear region, the output to input voltage relation reduces to:

$$V_{DIFF} = \frac{R_F}{R_{In}}(V_{IN} - V_{VCO})$$

Assuming $R_F$ and $R_{IN}$ are closely matched.

Figure 9:
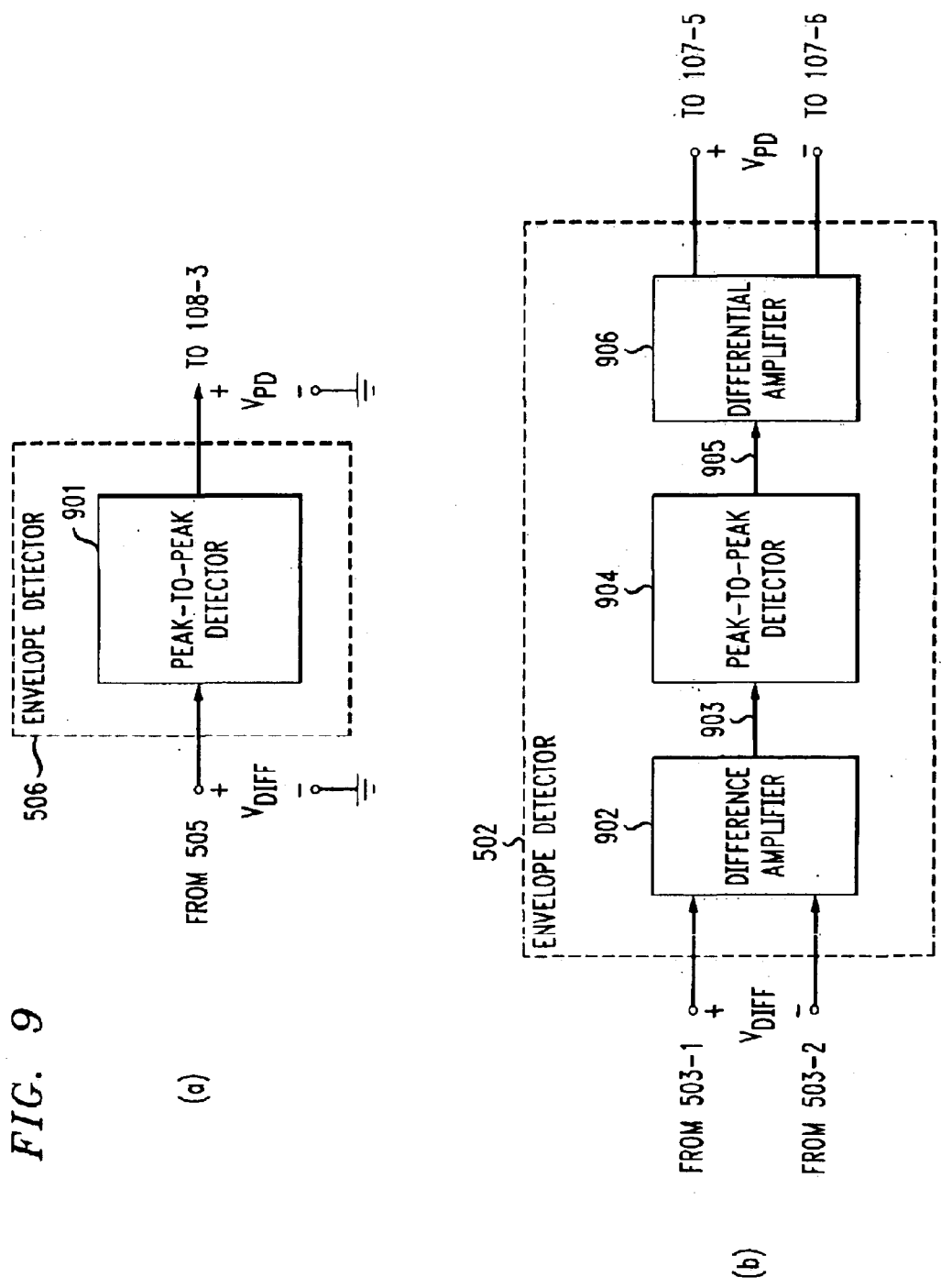
FIG. 9 depicts a block diagram of the components of the envelope detector of FIG. 5.

FIG. 9 depicts a block diagram of the components of the envelope detector of FIG. 5. FIG. 9a is the single-ended case, where envelope detector 506 simply comprises a peak-to-peak detector 901. FIG. 9b is the differential case, where envelope detector 502 comprises difference amplifier 902, which takes the differential input $V_{DIFF}$ from terminals 503-1 and 503-2, and amplifies $V_{DIFF}$ and places the signal-ended output on terminal 903. Peak-to-peak detector 904 is the same single ended peak-to-peak detector of FIG. 9a, which puts an approximate DC quantity proportional to the peak-to-peak voltage present on terminal 903 onto single-ended terminal 905. The signal-tended signal on terminal 905 is split into a differential signal via differential amplifier 1006, where the output differential signal $V_{PD}$ appears across terminals 107-5 and 107-6.

Figure 1:
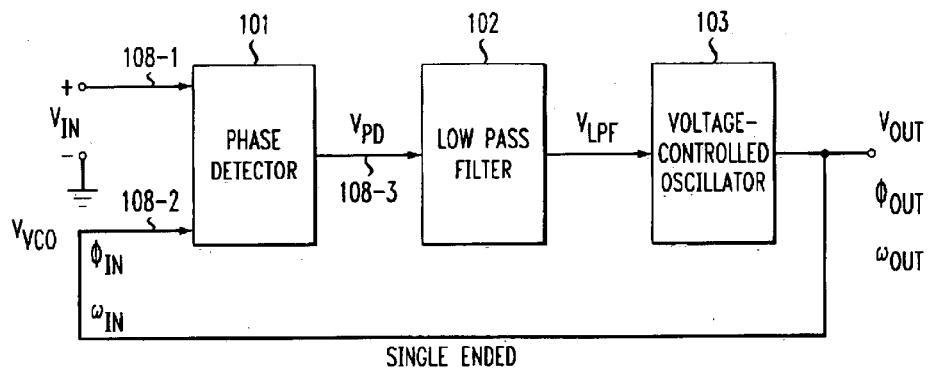
FIG. 1 depicts block diagrams of (a) a single-ended (signal-to-ground) and (b) differential phase-locked loop of the prior art.
Figure 1:
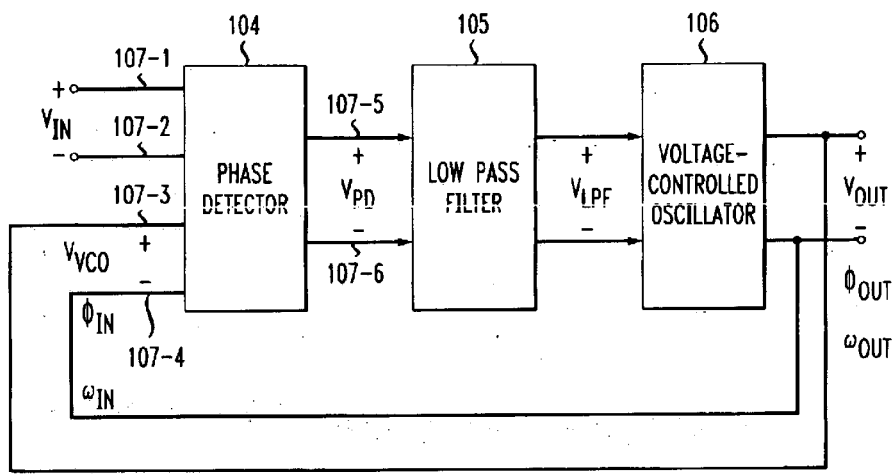
Figure 2:
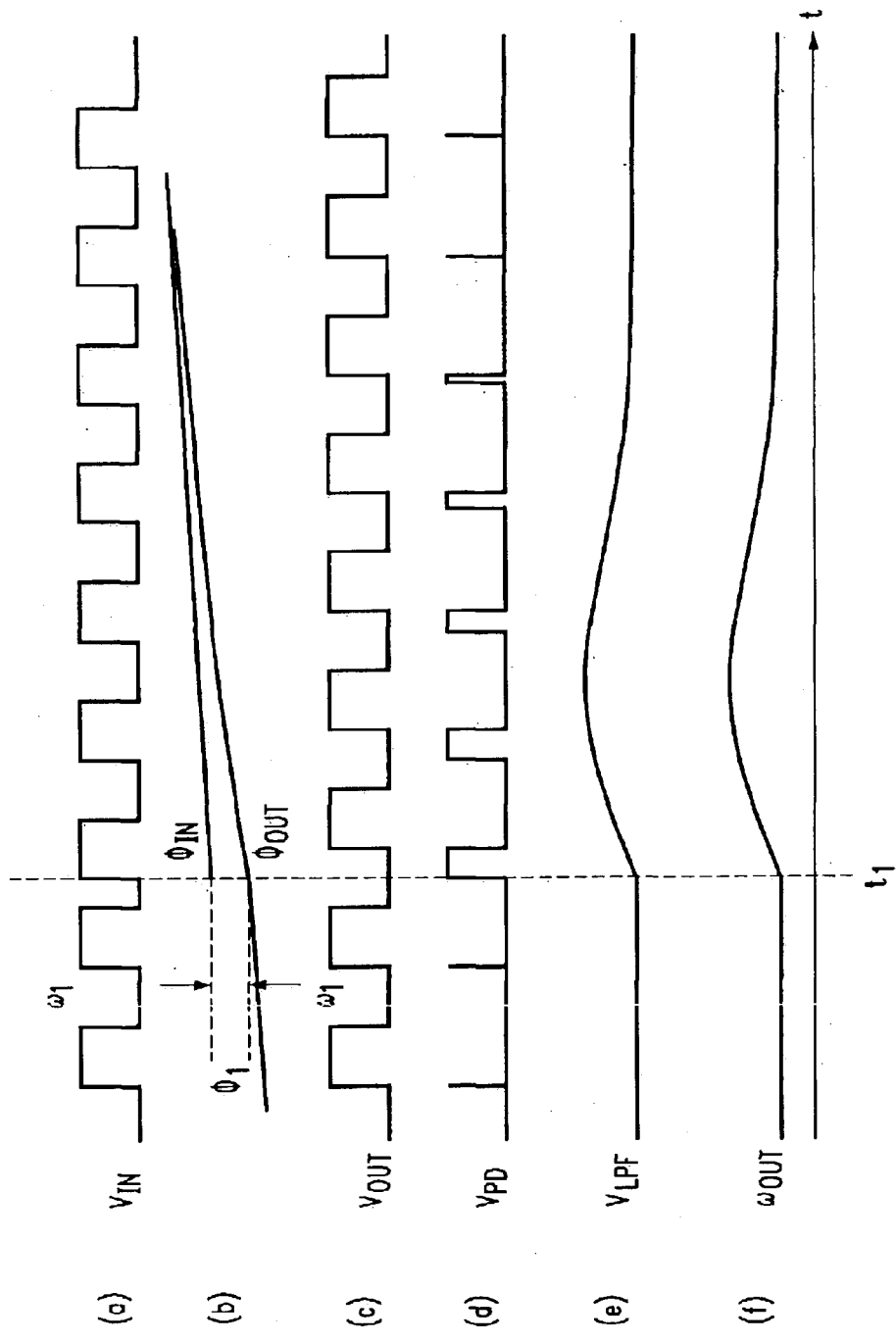
FIG. 2 depicts timing diagrams of the phase-locked loop of FIG. 1a to a step change of phase.
Figure 3:
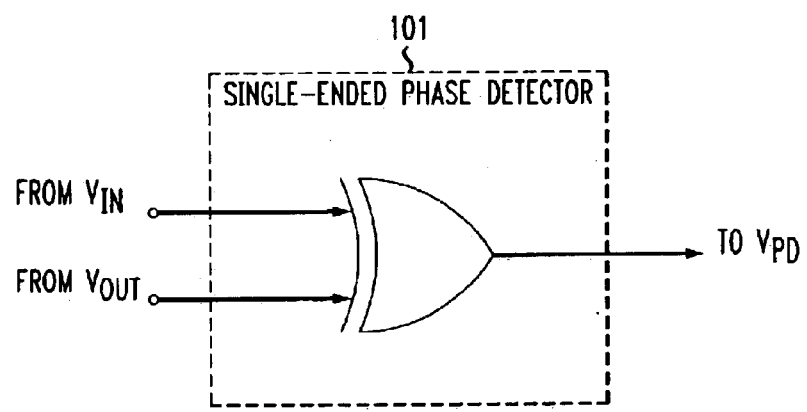
FIG. 3 depicts the logic diagram of a single-ended, digital implementation of phase detector 101 of the prior art.
Figure 3:
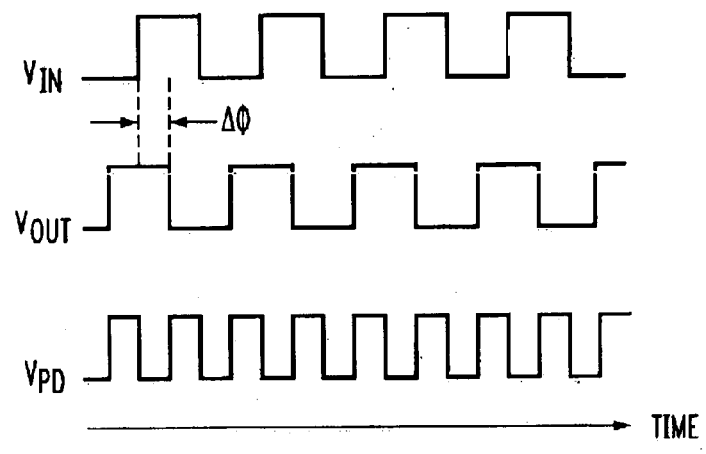
Figure 4:
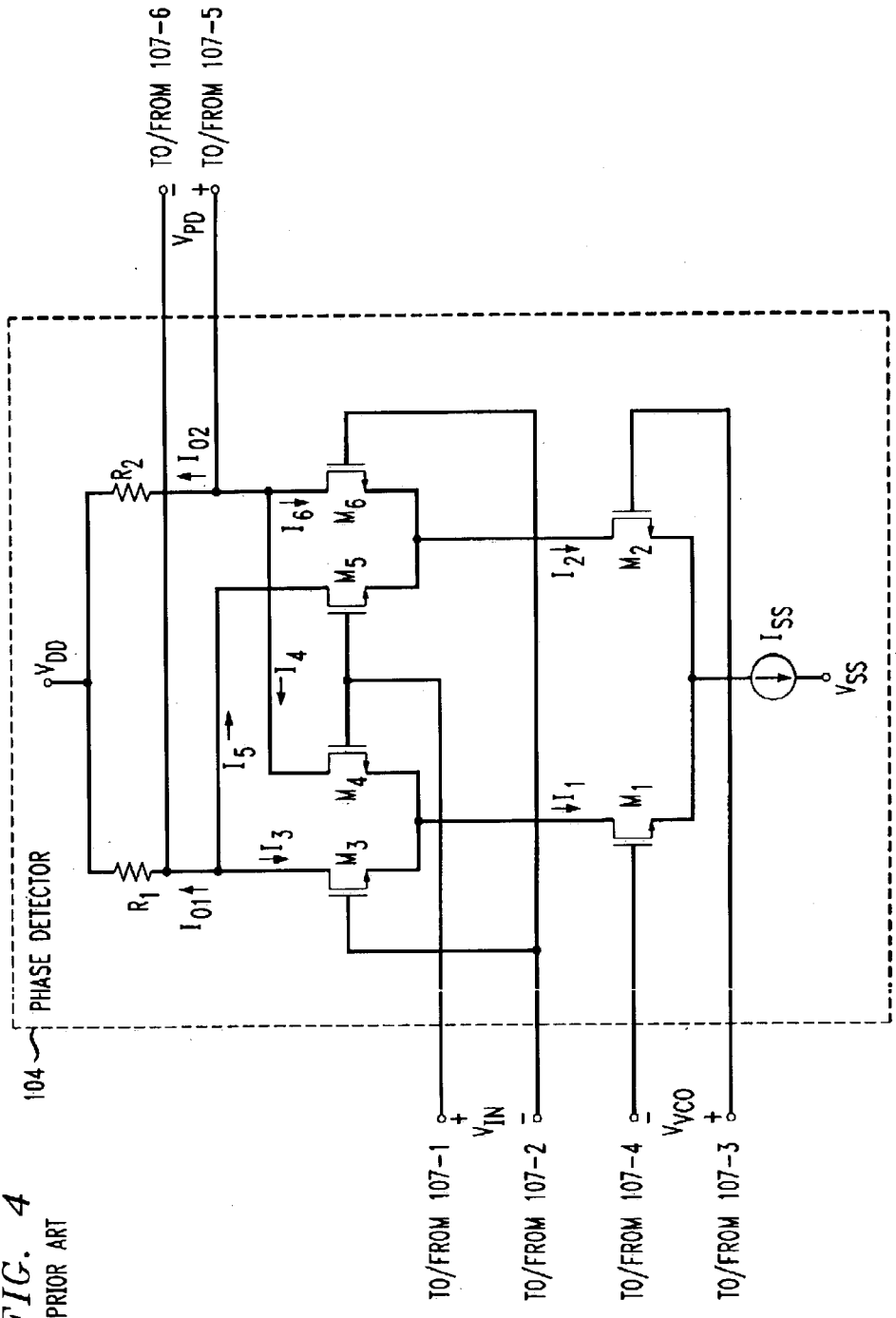
FIG. 4 depicts a schematic diagram of a differential version of the most common implementation of a phase detector for analog systems in the prior art, known as a Gilbert Multiplier cell.
Figure 10:
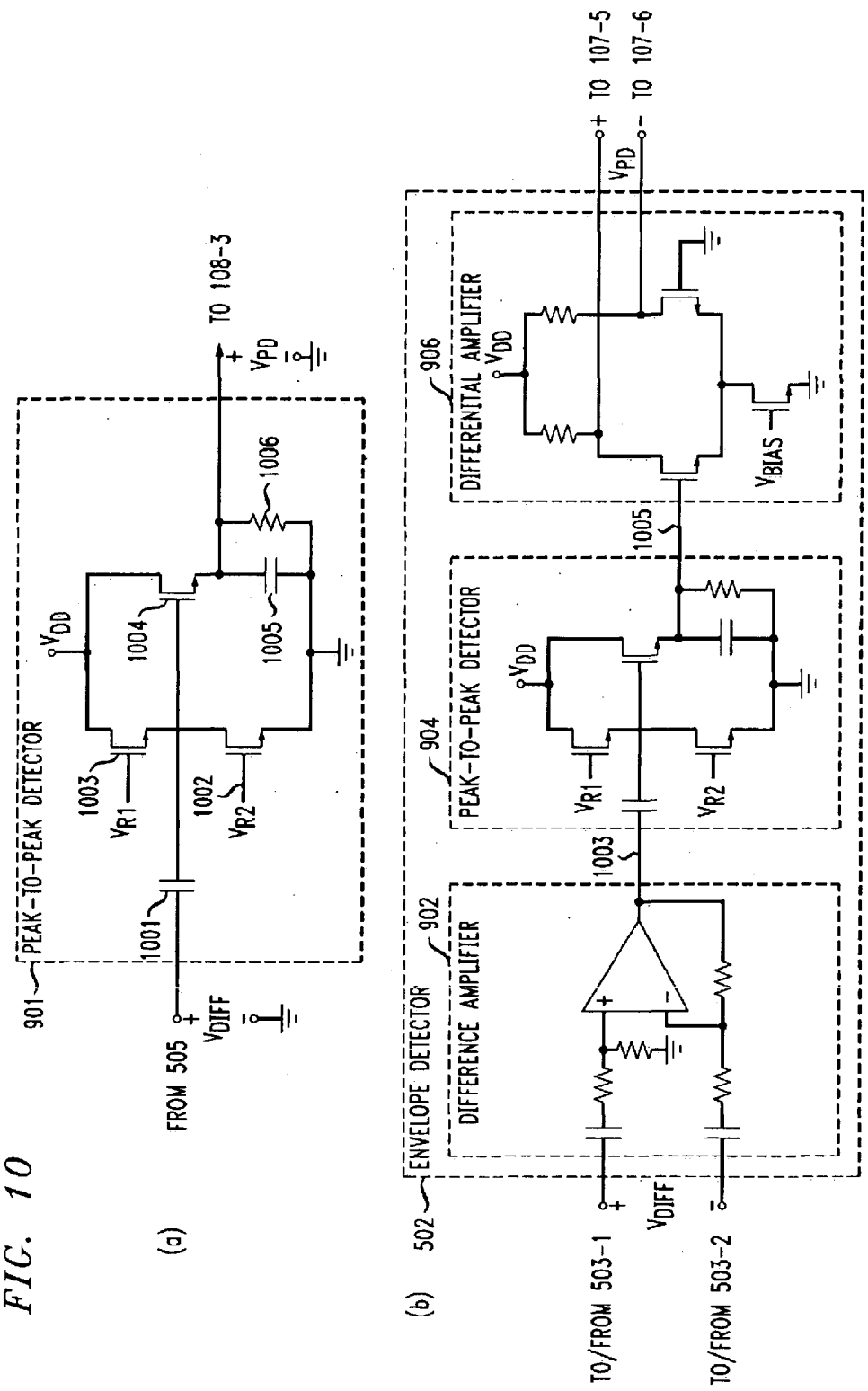
FIG. 10 shows the schematic diagrams of the components of the block diagrams of FIG. 9.

FIG. 10 shows the schematic diagrams of the components of the block diagrams of FIG. 9. FIG. 10a is a single-ended circuit of peak-to-peak detector 901. It is taken from FIG. 3 of U.S. Pat. No. 5,614,851, issued Mar. 25, 1997 to Holzer et al., herein incorporated by reference. The single-ended signal voltage is AC coupled to the circuit via capacitor 1001. The circuit comprises a clamp portion and a peak-detect portion. The clamp circuit is implemented with NMOS transistors 1002 and 1003, and input capacitor 1001. Transistor 1003 is connected as a voltage follower referenced to a fixed reference voltage $V_{R1}$. Transistor 1002 has its gate biased with fixed reference voltage $V_{R2}$. The peak-detect portion includes NMOS transistor 1004, a hold capacitor 1005 and a resistor 1006. Transistor 1004 is connected as a voltage follower so that the peak-to-peak voltage output appears across capacitor 1005 and resistor 1006. The hold capacitor 1005 holds the peak voltage value, while resistor 1006 causes the held peak voltage to drop exponentially toward zero volts so that the voltage across capacitor 1005 follows slowly varying peak voltage changes.

FIG. 10b is a "differential" version of FIG. 9a. The differential voltage $V_{DIFF}$ impressed on terminals 503-1 and 503-2 is AC-coupled via capacitors to the same difference amplifier 902 already described in FIG. 8. The single-ended output of this circuit 1003 is the input to the same peak-to-peak detector circuit already described In FIG. 9a. The output of this sub-circuit is "differentialized" via a differential amplifier, where one input of the amplifier is grounded. The differential output, $V_{PD}$ appears across terminals 107-5 and 107-6.

It is to be understood that the above-described embodiments are merely illustrative of the present invention and that many variations of the above-described embodiments can be devised by those skilled in the art without departing from the scope of the invention. It is therefore intended that such variations be Included within the scope of the following claims and their equivalents.

What is claimed is:

1. An apparatus comprising:
   (1) a difference amplifier comprising:
      (a) a first differential pair of terminals for carrying a first differential signal,
      (b) a second differential pair of terminals for carrying a second differential signal, and
      (c) a third differential pair of terminals for carrying a third differential signal, wherein said third differential signal is based on the difference between said first differential signal and said second differential signal; and
   (2) an envelope detector comprising:
      (a) a fourth differential pair of terminals electrically connected to said third differential pair of terminals, and (b) a fifth differential pair of terminals for carrying a fourth differential signal, wherein said fourth differential signal is based on the peak-to-peak amplitude of said third differential signal.

2. The apparatus of claim 1 further comprising:
(3) a low pass filter comprising:
   (a) a sixth differential pair of terminals that are electrically connected to said fifth differential pair of terminals, and
   (b) a seventh differential pair of terminals for carrying a fifth differential signal.

3. The apparatus of claim 2 wherein said fifth differential signal is a DC signal that is based on the phase difference between said first differential signal and said second differential signal.

4. The apparatus of claim 3 further comprising:
(4) a voltage-controlled oscillator comprising:
   (a) an eighth differential pair of terminals that are electrically connected to said seventh differential pair of terminals, and
   (b) a ninth differential pair of terminals that are electrically connected to said second differential pair of terminals.

5. An apparatus comprising:
(1) a difference amplifier comprising:
   (a) a first terminal for carrying a first signal,
   (b) a second terminal for carrying a second signal, and
   (c) a third terminal for carrying a third signal, wherein said third signal is based on the difference between said first signal and said second signal; and
(2) an envelope detector comprising:
   (a) a fourth terminal electrically connected to said third terminal, and
   (b) a fifth terminal for carrying a fourth signal, wherein said fourth signal is based on the peak-to-peak amplitude of said third signal.

6. The apparatus of claim 5 further comprising:
(3) a low pass filter comprising:
   (a) a sixth terminal that is electrically connected to said fifth terminal, and
   (b) a seventh terminal for carrying a fifth signal.

7. The apparatus of claim 6 wherein said fifth signal is a DC signal that is based on the phase difference between said first signal and said second signal.

8. The apparatus of claim 7 further comprising:
(4) a voltage-controlled oscillator comprising:
   (a) an eighth terminal that is electrically connected to said seventh terminal, and
   (b) a ninth terminal that is electrically connected to said second terminal.

9. An apparatus comprising:
a first NMOS transistor having a gate terminal, a drain terminal, and a source terminal;
a second NMOS transistor having a gate terminal, a drain terminal, and a source terminal, wherein said drain terminal of said first NMOS transistor is electrically connected to said drain terminal of said second NMOS transistor;
a first resistor having a first terminal and a second terminal, wherein said first terminal is electrically connected to said drain terminal of said first NMOS transistor; and
an envelope detector having a first input terminal, a second input terminal, and a first differential pair of terminals, wherein said first input terminal of said envelope detector is electrically connected to said drain terminal of said first NMOS transistor.

10. The apparatus of claim 9 further comprising:
a third NMOS transistor having a gate terminal, a drain terminal, and a source terminal, wherein said source terminal of said third NMOS transistor is electrically connected to said source terminal of said first NMOS transistor;
a fourth NMOS transistor having a gate terminal, a drain terminal, and a source terminal, wherein said source terminal of said fourth NMOS transistor is electrically connected to said source terminal of said third NMOS transistor, and wherein said drain terminal of said fourth NMOS transistor is electrically connected to said drain terminal of said third NMOS transistor;
a second resistor having a first and second terminal, wherein said first terminal of said second resistor is electrically connected to said drain terminal of said fourth NMOS transistor, and wherein said second terminal of said second resistor is electrically connected to said second terminal of said first resistor, and wherein said first terminal of said second resistor is electrically connected to said second input terminal of said envelope detector.

11. The apparatus of claim 10 further comprising a fifth NMOS transistor having a gate terminal, a drain terminal, and a source terminal, wherein said drain terminal of said fifth NMOS transistor is electrically connected to said source terminal of said first NMOS transistor.

12. The apparatus of claim 11 wherein said envelope detector measures the peak-to-peak signal of the difference in voltage on said first terminal of said first resistor and said first terminal of said second resistor.

13. The apparatus of claim 11 further comprising a low pass filter comprising:
(a) a second differential pair of terminals, and
(b) a third differential pair of terminals,
wherein said second differential pair of is electrically connected to said first differential pair of terminals.

14. The apparatus of claim 13 further comprising a voltage-controlled oscillator comprising:
(a) a fourth pair of differential terminals,
(b) a first output terminal, and
(c) a second output terminal,
wherein said fourth pair of differential terminals is electrically connected to said third differential pair of terminals, and wherein said first output terminal of said voltage-controlled oscillator is electrically connected to said gate terminal of said second NMOS transistor, and wherein said second output terminal of said voltage-controlled oscillator is electrically connected to said gate terminal of said fourth NMOS transistor.

15. The apparatus of claim 14 further comprising:
a first input terminal wherein said first input terminal is electrically connected to said gate terminal of said first NMOS transistor;
a second input terminal wherein said second input terminal is electrically connected to said gate terminal of said third NMOS transistor;
a bias input terminal wherein said bias input terminal is electrically connected to said gate terminal of said fifth NMOS transistor.

16. The apparatus of claim 14 further comprising a DC power supply having a positive terminal and a negative terminal, wherein said positive terminal of said power supply is electrically connected to said second terminal of said first resistor, and wherein said negative terminal of said power supply is electrically connected to said source terminal of said fifth NMOS transistor.

17. An method comprising:

comparing a first voltage to a second voltage, wherein comparing said first voltage to said second voltage produces a third voltage that is the difference between said first voltage and said second voltage;

obtaining the peak-to-peak voltage of said third voltage; and filtering said peak-to-peak voltage wherein a DC voltage is obtained that is based on the phase difference between said first voltage and said second voltage.

18. The method of claim 17 further comprising producing an AC voltage whose frequency is proportional to said DC voltage.

19. The method of claim 18 wherein said first voltage, said second voltage, said third voltage, said peak-to-peak voltage, and said DC voltage are selected from the group consisting of differential and single-ended.

20. An method comprising:

comparing a first current to a second current, wherein comparing said first current to said second current produces a third current that is the difference between said first current and said second current;

obtaining the peak-to-peak current of said third current; and filtering said peak-to-peak current wherein a DC current is obtained that is based on the phase difference between said first current and said second current.

* * * * *